(12) United States Patent
Ahn

(10) Patent No.: US 8,207,666 B2
(45) Date of Patent: Jun. 26, 2012

(54) ORGANIC ELECTROLUMINESCENT DEVICE WITH ENHANCED LIGHT EMISSION

(75) Inventor: Ju Won Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 28 days.

(21) Appl. No.: 12/650,942

(22) Filed: Dec. 31, 2009

(65) Prior Publication Data

US 2010/0141171 A1    Jun. 10, 2010

Related U.S. Application Data

(62) Division of application No. 11/316,730, filed on Dec. 27, 2005, now Pat. No. 7,671,531.

(30) Foreign Application Priority Data

Aug. 19, 2005  (KR) .................................. 2005-76384

(51) Int. Cl.
 *H05B 33/14* (2006.01)
(52) U.S. Cl. ........ 313/506; 313/507; 313/508; 315/291; 315/169.3
(58) Field of Classification Search .................. 315/291, 315/168, 169.3; 345/92; 313/503, 504, 506
See application file for complete search history.

(56) References Cited

U.S. PATENT DOCUMENTS

| 4,818,076 | A | 4/1989 | Heppke et al. |
|---|---|---|---|
| 5,837,391 | A | 11/1998 | Utsugi |
| 6,177,216 | B1 | 1/2001 | Broer et al. |
| 2002/0014837 | A1* | 2/2002 | Kim et al. ..................... 313/505 |
| 2002/0018060 | A1* | 2/2002 | Yamazaki et al. ............ 345/211 |
| 2004/0189167 | A1* | 9/2004 | Adachi et al. ................. 313/112 |
| 2004/0211961 | A1* | 10/2004 | Koo et al. ........................ 257/59 |
| 2004/0212296 | A1 | 10/2004 | Nakamura et al. |
| 2004/0219324 | A1 | 11/2004 | Hsu et al. |
| 2002/0251823 | | 12/2004 | Park et al. |
| 2004/0246225 | A1 | 12/2004 | Mukawa et al. |
| 2005/0093802 | A1 | 5/2005 | Yamazaki et al. |
| 2005/0179371 | A1 | 8/2005 | Broer et al. |
| 2005/0275343 | A1 | 12/2005 | Tanaka et al. |
| 2005/0282302 | A1 | 12/2005 | Yamazaki et al. |
| 2006/0046163 | A1 | 3/2006 | Broer et al. |

FOREIGN PATENT DOCUMENTS

| CN | 1329455 | 1/2002 |
|---|---|---|
| CN | 2682768 | 3/2005 |
| GB | 2 410 600 | 8/2005 |
| JP | 2003-282235 | 10/2003 |
| WO | WO 03-103068 | 12/2003 |
| WO | WO 2004/036299 | 4/2004 |

* cited by examiner

*Primary Examiner* — Douglas W Owens
*Assistant Examiner* — Amy Yang
(74) *Attorney, Agent, or Firm* — Morgan, Lewis & Bockius LLP

(57) ABSTRACT

An organic electroluminescent device is provided which includes a colored polarizer to reduce power consumption requirements for desired levels of brightness. The organic electroluminescent device includes a substrate, an anode electrode layer, an organic layer, a cathode electrode layer, and a colored polarizer provided on a surface of the substrate opposite a surface of the substrate on which the anode electrode layer is formed such that the colored polarizer polarizes light incident from the outside. The colored polarizer increases transmission of a given color of light based on the color(s) included in the polarizer to thereby decrease total current required by the organic electroluminescent device.

11 Claims, 2 Drawing Sheets

ORGANIC ELECTROLUMINESCENT DEVICE WITH ENHANCED LIGHT EMISSION

This application is a Divisional of U.S. patent application Ser. No. 11/316,730 filed Dec. 27, 2005 now U.S. Pat. No. 7,671,531 and claims priority to Korean Patent Application No. 2005-76384 filed in Korea on Aug. 19, 2005, both of which are hereby incorporated by reference in their entirety.

BACKGROUND OF THE INVENTION

1. Field of the Invention

The invention relates to a display device, and more particularly, an organic electroluminescent device.

2. Description of the Related Art

In an organic electroluminescent device, the brightness characteristics of the red pixels R are typically inferior to those of the green G and blue B pixels. Thus, more current should be applied the R pixels in order to emit the same level of brightness as the G and B pixels. For example, to emit 100 candela of brightness, 10 mA current should be applied to the G pixel, and 20 mA current should be applied to the B pixel. However, a 70 mA current should be applied to the R pixel in order to emit 100 cadela of brightness. Thus, a great deal of current is required to emit the same level of brightness from the R, G and B pixels, thereby increasing the power consumption of the organic electroluminescent device. Therefore, there is a need to decrease power consumption requirements of organic electroluminescent devices while maintaining desired display characteristics

SUMMARY OF THE INVENTION

An object of the invention is to solve at least the above problems and/or disadvantages and to provide at least the advantages described hereinafter.

It is an object of the invention to minimize power consumption.

Another object is to decrease total current required when the organic electroluminescent device emits.

Another object of the invention is to provide an organic electroluminescent device which decreases current required at the time of emitting of the organic electroluminescent device by using a colored polarizer according to brightness characteristics of R, G and B pixels.

To achieve these objects, in whole or in part, as embodied and broadly described herein, an organic electroluminescent device in accordance with an embodiment of the invention includes a substrate, an anode electrode layer, an organic layer, a cathode electrode layer and a colored polarizer, the colored polarizer polarizing light incident from the outside being adhered to a surface of the substrate contrary to an upper side of the substrate on which the anode electrode layer is formed.

As described above, the organic electroluminescent device in accordance with embodiments of the present invention may minimize power consumption by decreasing total current required when the organic electroluminescent device emits.

In addition, the organic electroluminescent device in accordance with embodiments of the invention uses a colored polarizer according to brightness characteristics of R, G and B pixels, thereby decreasing current required when the organic electroluminescent device emits.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DESCRIPTION OF EMBODIMENTS AND/OR BEST MODE

Figure 1A:
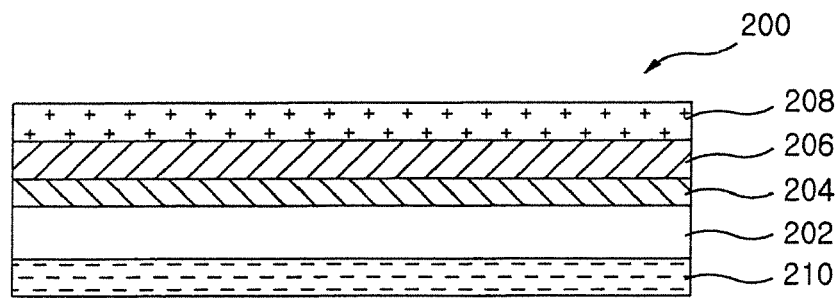
FIG. 1A is a sectional view of an organic electroluminescent device in accordance with an embodiment of the invention.

The organic electroluminescent device 200 shown in FIG. 1A includes a substrate 202, an anode electrode layer 204, an organic layer 206, a cathode electrode layer 208 and a colored polarizer 210. The anode electrode layer 204 may be provided on the substrate 202 by, for example, a deposition type process.

Figure 1B:
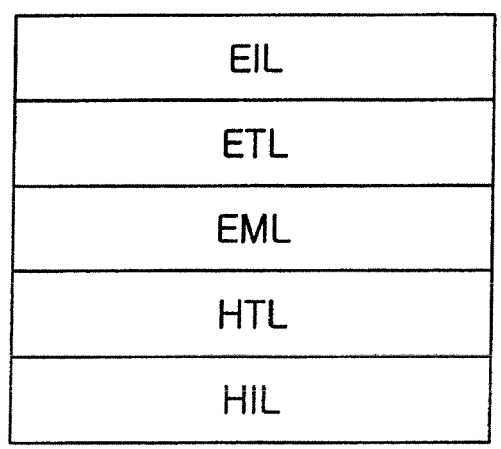
FIG. 1B is an exemplary sectional view of an organic emitting layer of e organic electroluminescent device shown in FIG. 2A.

The organic layer 206 may be provided on the anode electrode layer 204 by, for example, a deposition type process, and may include a hole injection layer (HIL), a hole transporting layer (HTL), an emitting layer (EML), an electron transporting layer (ETL), and an electron injection layer (EIL), as shown in FIG. 1B. These layers of the organic layer 206 may be formed in the sequence shown in FIG. 1B, however, other arrangements may also be appropriate. The cathode electrode layer 208 may be formed from a metal such as, for example, aluminum (Al), and may be provided on the organic layer 206 by, for example, a deposition type process.

Hereinafter, an emission process associated with the organic electroluminescent device 200 will be described in detail.

The anode electrode layer 204 provides holes to the HIL of the organic emitting layer 206 if a certain positive voltage is applied thereto. The cathode electrode layer 208 provides electrons to the EIL of the organic emitting layer 206 if a certain negative voltage is applied thereto. The HIL smoothly injects the holes provided from the anode electrode layer 204 to the HTL, and the EIL smoothly injects the electrons provided from the cathode electrode layer 208 to the ETL. The HTL then transports the holes received from the HIL into the EML, and the ETL transports the electrons received from the EIL into the EML. The transported holes and electrons are recombined in the EML, and a light having a predetermined wavelength is from the EML of the organic emitting layer 206 to the outside through the substrate 202 and the polarizer 210.

The polarizer 210 may be provided on a surface of the substrate 202 which is opposite an upper surface of the substrate 202 on which the anode electrode layer 204 is provided, that is, a lower surface of the substrate 202, as shown in FIG. 1A. However, other positions for the polarizer 210 may also be appropriate. For example, the polarizer 210 may be provided between the substrate 202 and the anode electrode layer 204. The polarizer 210 transmits the light emitted by EML with a given transmissivity, and may also intercept light reflected from the cathode electrode layer 208, thereby improving contrast in the image displayed by the organic electroluminescent device 200.

The polarizer 210 in accordance with an embodiment of the invention may include a red-colored substance. If the brightness characteristics of the R pixel are inferior to those of the G and B pixels, then more current would have to be applied to the R to yield the same brightness. However, by using a colored polarizer 210 which includes a red-colored substance, emission of red color from the R pixels may be improved when compared to a regular polarizer without applying additional current to the R pixels.

Thus, an organic electroluminescent device 200 which includes this type of colored polarizer 210, in accordance with an embodiment of the invention, can emit red light at the same level of brightness as the green and blue light without increased power consumption. Thus, power consumption requirements of the R pixel for a given level of brightness may be decreased.

Figure 2:
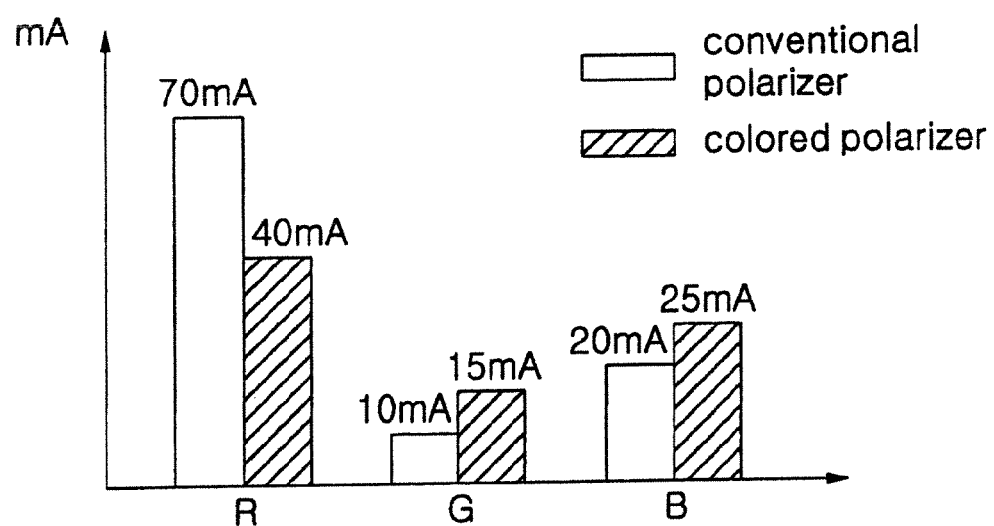
FIG. 2 is a bar graph comparing current required to emit a given level of brightness using different types of polarizers.

FIG. 2 is a bar graph comparing current required to emit a given level of brightness by R, G and B pixels using different types of polarizers. As shown in FIG. 2, to emit 100 candela of brightness in an organic electroluminescent device 200 as shown in FIGS. 1A-B, using a colored polarizer 210 in accordance with an embodiment of the invention, only 40 mA of current is supplied to the R pixel to achieve the desired 100 candela of brightness. Thus, compared to the regular polarizer, power consumption requirements of the R pixel may be decreased by about 30 mA.

This may cause the current consumed by the G and B pixels to be slightly increased due to the red-color included in the colored polarizer 210, and so more current may need to be applied to emit acceptable levels of green light or blue light. However, as the G and B pixels have higher brightness characteristics, the G and B pixels can emit the same level of brightness as the R pixel with only a small amount of additional current.

For example, in order to emit 100 candela of brightness from the organic electroluminescent device 200 in accordance with an embodiment of the invention, the G pixel needs approximately 15 mA of current, which is only about 5 mA more than the current required by an electroluminescent device using a regular polarizer. Likewise, to emit 100 candela of brightness, the B pixel needs approximately 25 mA of current, which is only about 5 mA more than the current required by the device using a regular polarizer. Accordingly, to emit 100 candela of brightness, the total current required by an organic electroluminescent device in accordance with an embodiment of the invention is approximately 80 mA, which is approximately 20 mA less than the current required by a device using a regular polarizer, whose total required current is approximately 100 mA.

The relationship between the levels of current which should be supplied to each of the R, G and B pixels in order to maintain a given level of brightness, such as, for example, the 100 candela of brightness shown m FIG. 2, is substantially linear. Thus, a ratio may be applied to approximate the relative levels of current required to maintain a particular level of brightness. For example, based on the exemplary data shown in FIG. 2, a ratio of the current required by the R pixel (70 mA) to the current required by the G pixel (15 mA) is approximately 2.6, compared to a ratio of 7 when using the regular polarizer Likewise, a ratio of the current required by the R pixel (70 mA) to the current required by the B (25 mA) pixel is approximately 1.6, compared to a ratio of 3.5 when using the regular polarizer.

Thus, power consumption in accordance with an embodiment of the invention may be decreased for a given level of brightness by using a polarizer as described above and applying appropriate levels of current. Additionally, by controlling of a concentration of a red-colored substance in a colored polarizer of an organic electroluminescent device in accordance with an embodiment of the invention, power consumed by each of the R, G and B pixels may be controlled.

Additionally, the colored polarizer 210 may include substances having green-color, or blue-color. That is, the color of the polarizer 210 can be controlled based on desired brightness characteristics or main emitting color of an organic electroluminescent device in accordance with an embodiment of the invention.

The foregoing embodiments and advantages are merely exemplary and are not to be construed as limiting the present invention. The present teaching can be readily applied to other types of apparatuses. The electroluminescent device of the present invention may be used in or formed as flexible display for electronic books, newspapers, magazines, etc., different types of portable devices, e.g., handsets, MP3 players, notebook computers, etc., audio applications, navigation applications, televisions, monitors, or other types of devices using a display, either monochrome or color. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of operating an electroluminescent device comprising a substrate having first and second surfaces, the first and second surfaces being different surfaces; an anode electrode layer over the first surface; an organic emitting layer provided on the anode layer; a cathode electrode layer provided on the organic emitting layer; and a polarizer provided on at least one of the first surface or the second surface of the substrate, the method comprising the step of:
    providing a first current to the anode electrode layer to produce a first color of light emitted by the organic emitting layer, the first color of light being transmitted outside through the substrate and the polarizer;
    providing a second current to the anode electrode layer to produce a second color of light emitted by the organic emitting layer, the first color of light being transmitted outside through the substrate and the polarizer; and
    providing a third current to the anode electrode layer to produce a third color of light emitted by the organic emitting layer, the first color of light being transmitted outside through the substrate and the polarizer,
    wherein a magnitude of the first current is less than approximately 7 times a magnitude of the second current, and less than approximately 3.5 times a magnitude of the third current,
    wherein the polarizer includes only one colored substance corresponding to one color of light emitted by the electroluminescent layer, and the one colored substance is uniformly dispersed at total surface area of the polarizer.

2. The method of claim 1, wherein the magnitude of the first current is between approximately 2 and 7 times the magnitude of the second current.

3. The method of claim 2, wherein the magnitude of the first current is approximately 2.6 times the magnitude of the second current.

4. The method of claim 1, wherein the magnitude of the first current is between approximately 1.5 and 3.5 times the magnitude of the third current.

5. The method of claim 4, wherein the magnitude of the first current is approximately 1.6 times the magnitude of the third current.

6. The method of claim 1, wherein providing a first current to produce a corresponding first color of light comprises applying the first current to a red emission area of the device so as to produce red light.

7. The method of claim 6, wherein providing a second current to produce a corresponding second color of light comprises applying the second current to a green emission area of the device so as to produce green light.

8. The method of claim 7, wherein providing a third current to produce a corresponding third color of light comprises applying the first current to a blue emission area of the device so as to produce blue light.

9. The method of claim 1, further comprising emitting the first, second and third colors of light through a polarizer including a colored substance corresponding to one of the first, second or third colors of light.

10. The method of claim 9, wherein the polarizer includes a red colored substance configured to increase a transmission of red light.

11. The method of claim 9, further comprising selecting the colored substance based on a pixel color of the device which requires the highest current to produce a given level of brightness.

* * * * *